US010090027B2

United States Patent
Wu (10) Patent No.: US 10,090,027 B2
(45) Date of Patent: Oct. 2, 2018

(54) MEMORY SYSTEM WITH LOW READ POWER

(71) Applicant: eMemory Technology Inc., Hsin-Chu (TW)

(72) Inventor: Po-Ching Wu, New Taipei (TW)

(73) Assignee: eMemory Technology Inc., Hsin-Chu (TW)

( * ) Notice: Subject to any disclaimer, the term of this patent is extended or adjusted under 35 U.S.C. 154(b) by 0 days.

(21) Appl. No.: 15/603,478

(22) Filed: May 24, 2017

(65) Prior Publication Data

US 2017/0345464 A1 Nov. 30, 2017

Related U.S. Application Data

(60) Provisional application No. 62/341,105, filed on May 25, 2016.

(51) Int. Cl.
G11C 7/00 (2006.01)
G11C 7/06 (2006.01)
G11C 7/22 (2006.01)
G11C 7/12 (2006.01)

(52) U.S. Cl.
CPC ............... *G11C 7/065* (2013.01); *G11C 7/12* (2013.01); *G11C 7/22* (2013.01); *G11C 7/06* (2013.01); *G11C 7/062* (2013.01)

(58) Field of Classification Search
CPC .. G11C 7/065; G11C 7/12; G11C 7/22; G11C 7/00; G11C 7/1051; G11C 7/06; G11C 7/062
USPC .... 365/189.05, 189.02, 189.15, 189.16, 205, 365/207, 63
See application file for complete search history.

(56) References Cited

U.S. PATENT DOCUMENTS

| 5,754,482 | A | 5/1998 | Su |
| 6,917,541 | B2 | 7/2005 | Shimbayashi |
| 9,070,424 | B2 | 6/2015 | Youn |
| 2010/0165755 | A1* | 7/2010 | Dhori ............... G11C 7/08 365/189.15 |
| 2010/0172199 | A1 | 7/2010 | Mishra |
| 2011/0188311 | A1 | 8/2011 | Stiegler |

(Continued)

FOREIGN PATENT DOCUMENTS

| EP | 0 337 393 A2 | 10/1989 |
| JP | H04-216400 A | 8/1992 |

(Continued)

*Primary Examiner* — Tan T Nguyen
(74) *Attorney, Agent, or Firm* — Winston Hsu (57) ABSTRACT

A memory system includes a first memory bank, a first path selector, a second memory bank, a second path selector, and a sensing device. The first memory bank includes a plurality of first memory cells. The second memory bank includes a plurality of second memory cells. The first path selector includes a plurality of input terminals coupled to the first memory cells through a plurality of first bit lines, and two output terminals. The second path selector includes a plurality of input terminals coupled to the second memory cells through a plurality of second bit lines, and two output terminals. The sensing device is coupled to the output terminals of the first bank selector and the second bank selector, and senses the difference between currents outputted from two of the reference current source, and the terminals of the two bank selectors according to the required operations.

15 Claims, 4 Drawing Sheets

(56) References Cited

U.S. PATENT DOCUMENTS

| | | | |
|---|---|---|---|
| 2015/0078103 A1* | 3/2015 | Roy | G11C 7/08 |
| | | | 365/189.05 |
| 2016/0049179 A1* | 2/2016 | La Rosa | G11C 7/065 |
| | | | 365/189.05 |

FOREIGN PATENT DOCUMENTS

| | | |
|---|---|---|
| JP | H07-73663 A | 3/1995 |
| JP | H07-78465 A | 3/1995 |
| JP | H11-288600 A | 10/1999 |
| JP | 2013-251035 A | 12/2013 |

* cited by examiner

MEMORY SYSTEM WITH LOW READ POWER

CROSS REFERENCE TO RELATED APPLICATIONS

This non-provisional application claims priority of U.S. provisional application No. 62/341,105, filed on May 25, 2016, included herein by reference in its entirety.

BACKGROUND OF THE INVENTION

1. Field of the Invention

This invention is related to a memory system, especially to a memory system having low read power.

2. Description of the Prior Art

Nowadays, mobile electronic devices are used to perform various kinds of applications, such as watching movie, taking pictures, listening to music . . . , and so on. To support as many applications as possible, mobile electronic devices may require large memory space; therefore, the requirement for large memory space has become critical for mobile electronic devices.

However, as memory size increases, power required for operating memory also increases. For example, when more memory cells are embedded into one single memory bank, each bit line of the memory bank will be coupled to more memory cells. In this case, if one of the memory cells is to be read through one bit line, then the read current generated by the memory cell has to charge all parasitic capacitance of other memory cells coupled to the same bit line. Consequently, the read current may become difficult to identify and the reading speed may be lowered due to the long charging path of the bit line. One solution is to increase the memory current generated by the memory cell, however, the increased memory cell will cause higher read power, conflicting with the low power requirement of the mobile electronic devices.

SUMMARY OF THE INVENTION

One embodiment of the present invention discloses a memory system. The memory system includes a first memory bank, a first path selector, a second memory bank, a second path selector, and a current sending device.

The first memory bank includes M×N first memory cells, and N first bit lines, each coupled to M first memory cells of the M×N first memory cells. M is a positive integer and N is a positive integer greater than 1. The first path selector includes N input terminals coupled to the N first bit lines, a first output terminal, and a second output terminal.

The second memory bank includes M×N second memory cells, and N second bit lines, each coupled to M second memory cells of the M×N second memory cells. The second path selector includes N input terminals coupled to the N second bit lines, a first output terminal, and a second output terminal.

The sensing device is coupled to the first output terminal of the first bank selector, the second output terminal of the first bank selector, the first output terminal of the second bank selector, and the second output terminal of the second bank selector. The sensing device senses a difference between currents outputted from the first output terminal of the first bank selector and the second output terminal of the first bank selector, between currents outputted from the first output terminal of the second bank selector and the second output terminal of the second bank selector, or between a reference current and a current outputted from one of the first output terminal of the first bank selector, the second output terminal of the first bank selector, the first output terminal of the second bank selector, and the second output terminal of the second bank selector.

Another embodiment of the present invention discloses a sensing device. The sensing device includes a first bank selector, a second bank selector, and a differential sense amplifier.

The first bank selector has a first input terminal coupled to a first memory cell, a second input terminal coupled to a second memory cell, and an output terminal. The second bank selector has a first input terminal coupled to a third memory cell, a second input terminal coupled to a fourth memory cell, and an output terminal. The differential sense amplifier has a first input terminal coupled to the output terminal of the first bank selector, and a second input terminal coupled to the output terminal of the second bank selector.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
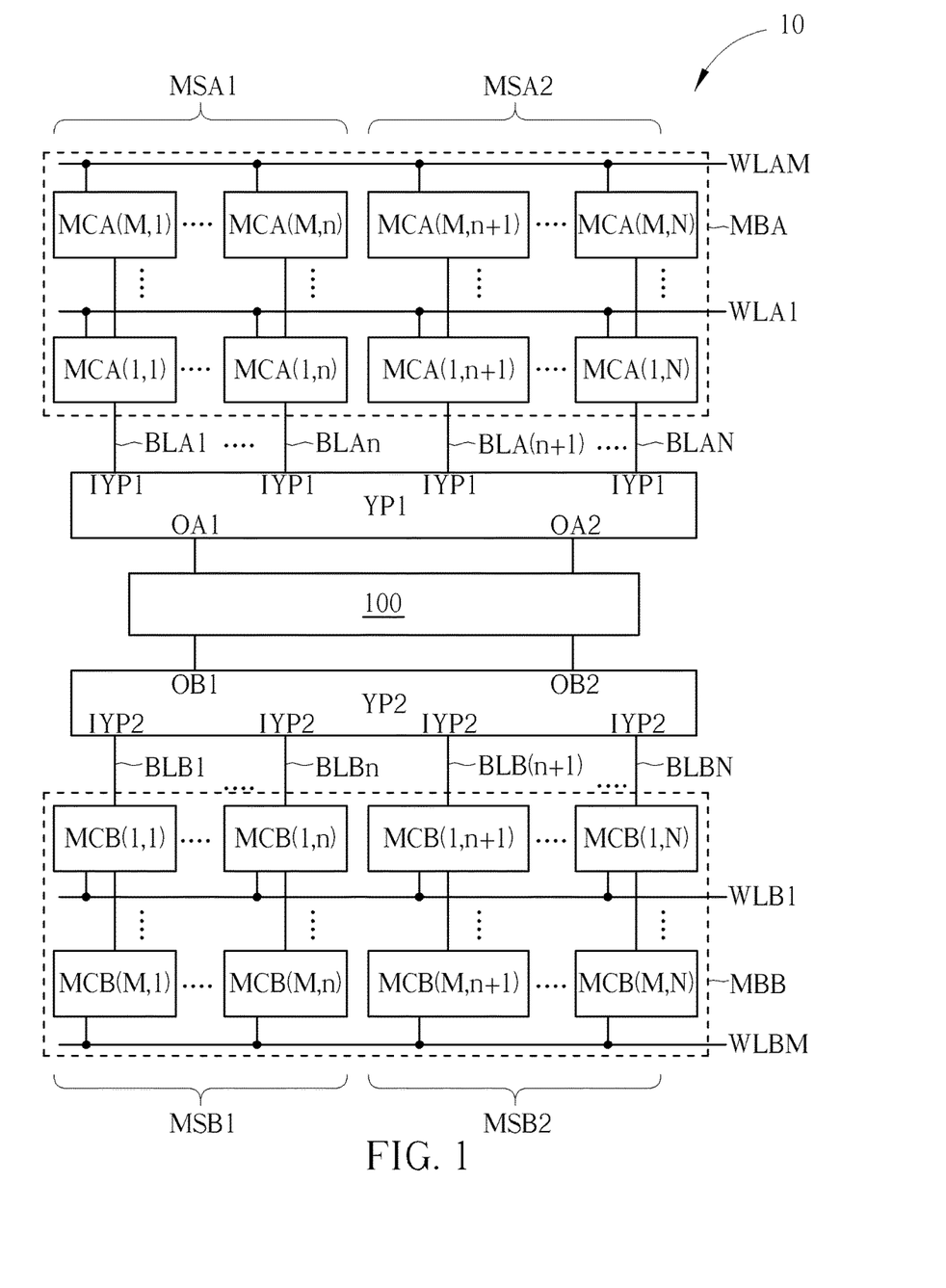
FIG. 1 shows a memory system according to one embodiment of the present invention.

FIG. 1 shows a memory system 10 according to one embodiment of the present invention. The memory system 10 includes a first memory bank MBA, a first path selector YP1, a second memory bank MBB, a second path selector YP2, and a sensing device 100.

The first memory bank MBA includes M×N first memory cells MCA(1,1) to MCA(M,N), and N first bit lines BLA1 to BLAN, where M is a positive integer and N is a positive integer greater than 1. Each of the first bit lines BLA1 to BLAN is coupled to M first memory cells of the M×N first memory cells MCA(1,1) to MCA(M,N). The first path selector YP1 includes N input terminals IYP1 coupled to the N first bit lines BLA1 to BLAN, a first output terminal OA1, and a second output terminal OA2.

The second memory bank MBB has the same structure as the first memory bank MBA. The second memory bank MBB includes M×N second memory cells MCB(1,1) to MCB(M,N), and N second bit lines BLB1 to BLBN. Each of the second bit lines BLB1 to BLBN is coupled to M second memory cells of the M×N second memory cells MCB(1,1) to MCB(M,N). The second path selector YP2 includes N input terminals IYP2 coupled to the N second bit lines BLB1 to BLBN, a first output terminal OB1, and a second output terminal OB2.

The sensing device 100 is coupled to the first output terminal OA1 of the first bank selector YP1, the first output terminal OB1 of the second bank selector YP2, the second output terminal OA2 of the first bank selector YP1, and the second output terminal OB2 of the second bank selector YP2. The sensing device 100 can be used to sense the difference between the received currents. By sensing the difference between the received currents, the information stored in the first memory cells MCA(1,1) to MCA(M,N) and the second memory cells MCB(1,1) to MCB(M,N) can be identified.

In some embodiments, M first memory cells of the first memory bank MBA are coupled to a word line. For example, the first memory cells MCA (1, 1) to MCA (1, N) maybe coupled to the word line WLA1, while the first memory cells MCA(M,1) to MCA(M,N) may be coupled to the word line WLAM. In this case, the first memory cells MCA(1,1) to MCA(1,N) may be turned on simultaneously, and the first memory cells MCA(M,1) to MCA(M,N) may be turned on simultaneously.

Although each word lines WLA1 to WLAM are disposed in parallel one line at a row, the layout of the first memory bank MBA may be altered according to the system requirement. For example, in some embodiments, a plurality of word lines may be disposed in a same row so that the layout of the first memory bank MBA would have a shape of square, reducing the total trace length of the word lines and the bit lines.

Furthermore, the first memory cells MCA(1,1) to MCA(M,N) include a first set of first memory cells MSA1 and a second set of first memory cells MSA2, and data saved in the first set of first memory cells MSA1 are complementary to data saved in the second set of first memory cells MSA2. For example, if N is a positive even number and n is half of N, then the first set of first memory cells MSA1 may include the first memory cells MCA (1, 1) to MCA (M, n) and the second set of first memory cells MSA2 may include the first memory cells MCA(1, n+1) to MCA(M,N). Also, the first memory cell MCA(j,k) may correspond to the first memory cell MCA (j,n+k). That is, data stored in the first memory cell MCA(j,k) and the first memory cell (j,n+k) are complementary to each other where M≥j≥1and n≥k≥1.

In this case, during a read operation of a selected first memory cell, the first memory cell MCA(1,1) for example, both the selected first memory cell MCA(1,1) and the first memory cell MCA(1,n+1) corresponding to the selected first memory cell MCA (1, 1) may generate the read current according to the stored data, and the sensing device 100 can identify the data stored in the selected first memory cell by sensing the two read currents.

Since the data stored in these two corresponding first memory cells MCA(1,1) and MCA(1,n+1) are complementary to each other, the read currents generated by these two first memory cells MCA(1, 1) and MCA (1, n+1) would also be different. For example, if the first memory cell MCA(1,1) is programmed and the first memory cell MCA(1,n+1) is erased, then the first memory cell MCA(1,1) may generate only insignificant current or not generate any current and the first memory cell MCA(1,n+1) may generate an identifiable current. The differential currents generated by the first memory cells MCA(1,1) and MCA(1,n+1) allow the sensing device 100 to identify the stored data faster with higher accuracy.

Similarly, the second memory bank MBB may have the same structure as the first memory bank MBA. That is, M second memory cells of the second memory bank MBB are coupled to a word line. For example, the second memory cells MCB (1,1) to MCB (1,N) may be coupled to the word line WLB1, while the second memory cells MCB (M,1) to MCB(M,N) may be coupled to the word line WLBM. Also, the second memory cells MCB (1,1) to MCB(M,N) include a first set of second memory cells MSB1 and a second set of second memory cells MSB2, and data saved in the first set of second memory cells MSB1 are complementary to data saved in the second set of second memory cells MSB2.

For example, the first set of second memory cells MSB1 may include the second memory cells MCB (1,1) to MCB (M,n) and the second set of second memory cells MSB2 may include the second memory cells MCB (1, n+1) to MCB (M,N) . Also, the second memory cell MCB(j,k) may correspond to the second memory cell MCB(j,n+k) . That is, data stored in the second memory cell MCB (j,k) and the second memory cell MCB (j,n+k) are complementary to each other.

In this case, to ensure the sensing device 100 is able to sense the differential currents outputted from the selected memory cell and its corresponding memory cell, for example the first memory cell MCA(1,1) and the first memory cell MCA(1,n+1) corresponding to the first memory cell MCA(1,1), the memory system 10 may use the word line WLA1 to turn on the first memory cells MCA(1,1) to MCA(1,N), the path selector YP1 can further select the desired first memory cells MCA(1,1) and MCA(1,n+1) through the bit lines BLA1 to BLAN, and the sensing device 100 can further select the desired memory bank which the first memory cells MCA(1,1) and MCA(1,n+1) belonging to.

Figure 2:
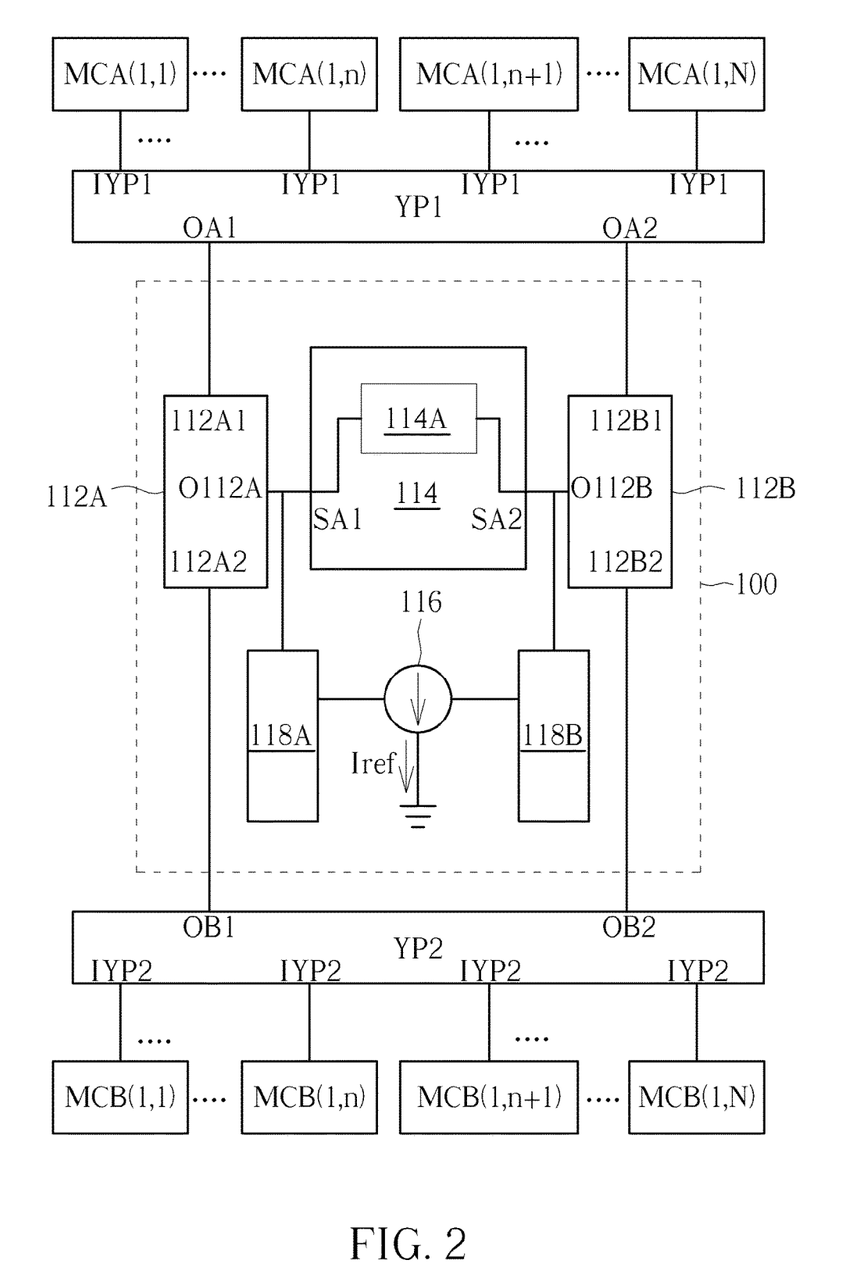
FIG. 2 shows a sensing device of the memory system in FIG. 1 according to one embodiment of the present invention.

FIG. 2 shows the sensing device 100 according to one embodiment of the present invention. The sensing device 100 includes a first bank selector 112A, a second bank selector 112B, and a differential sense amplifier 114.

The first bank selector 112A has a first input terminal 112A1 coupled to the first output terminal OA1 of the first path selector YP1, a second input terminal 112A2 coupled to the first output terminal OB1 of the second path selector YP2, and an output terminal O112A. The second bank selector 112B has a first input terminal 112B1 coupled to the second output terminal OA2 of the first path selector YP1, a second input terminal 112B2 coupled to the second output terminal OB2 of the second path selector YP2, and an output terminal O112B. The differential sense amplifier 114 has a first input terminal SA1 coupled to the output terminal O112A of the first bank selector 112A and a second input terminal SA2 coupled to the output terminal O112B of the second bank selector 112B.

Figure 3:
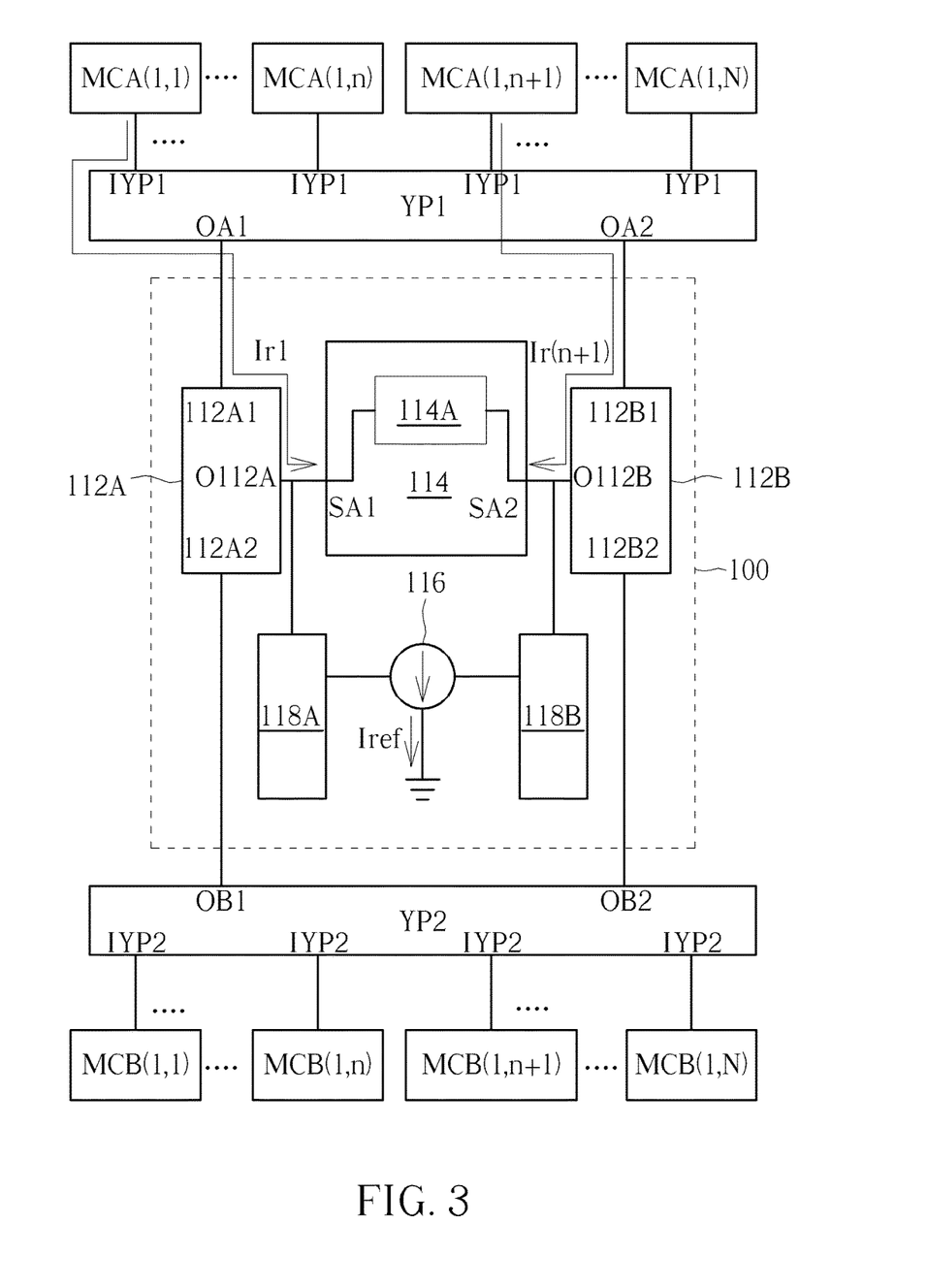
FIG. 3 shows the current paths of the memory system in FIG. 1 during a read operation of the selected first memory cell.

FIG. 3 shows the current paths of the memory system 10 during a read operation of the selected first memory cell MCA(1,1). During the read operation of the selected first memory cell MCA(1,1), the first path selector YP1 establishes an electrical connection between an input terminal IYP1 of the first path selector YP1 coupled to the selected first memory cell MCA(1,1) and the first output terminal OA1 of the first path selector YP1, and establishes an electrical connection between an input terminal IYP1 of the first path selector YP1 coupled to the first memory cell MCA(1,n+1) and the second output terminal OA2 of the first path selector YP1.

The first bank selector 112A establishes an electrical connection between the first input terminal 112A1 of the first bank selector 112A and the output terminal O112A of the first bank selector 112A. Also, the second bank selector 112B establishes an electrical connection between the first input terminal 112B1 of the second bank selector 112B and the output terminal O112B of the second bank selector 112B.

Consequently, the differential sense amplifier 114 is able to receive the read currents Ir1 and Ir (n+1) generated by the first memory cells MCA (1, 1) and MCA (1, n+1), and the data stored in the first memory cell MCA(1,1) can be identified by sensing the difference between the read currents Ir1 and Ir (n+1). Also, the same operation principle can be applied when reading a second memory cell in the second memory bank MBB.

In some embodiments, the differential sense amplifier 114 may include a pre-charge circuit 114A which can pre-charge the first input terminal SA1 and the second input terminal SA2 of the differential sense amplifier 114 to a predetermined voltage, and two selected bit lines may be also pre-charged to the predetermined voltage through the bank selectors 112A and 112B and a selected path selector before sensing the currents, ensuring the sensing accuracy and the reading speed.

For example, the pre-charge circuit 114A may include a first NMOS transistor and a second NMOS transistor. The first NMOS transistor has a drain terminal connected to a voltage source for providing the predetermined voltage, and a source terminal connected to the first input terminal SA1 of the differential sense amplifier 114. The second NMOS has a drain terminal connected to the voltage source, and a source terminal connected to the second input terminal SA2 of the differential sense amplifier 114.

However, the leakage current may be generated if the pre-charge circuit 114A is turned on for pre-charge when the memory cells MCA(1, 1) and MCA(1,n+1) have been turned on and the electrical connections to the memory cells have been established. Therefore, to reduce the leakage current, the differential sense amplifier 114 can be pre-charged after the first path selector YP1 establishes the electrical connections, and the word line WLA1 can turn on the selected first memory cell MCA (1, 1) and the first memory cell MCA (1,n+1) corresponding to the selected first memory cell MCA (1, 1) after the pre-charge circuit 114A finishes pre-charging and is turned off. That is, the first memory cells MCA(1, 1) and MCA (1, n+1) are turned on after the differential sense amplifier 114 is pre-charged, so that no short-circuited path would be established during the pre-charge operation.

However, in some embodiments, the differential sense amplifier 114 can be a latch type differential sense amplifier. In this case, the differential sense amplifier 114 can be pre-charged after the first path selector YP1 establishes the electrical connections, and the word line WLA1 can turn on the selected first memory cells MCA(1, 1) and MCA (1,n+1) before the differential sense amplifier 114 is pre-charged.

Since the sensing device 100 can sense the difference between currents outputted from the first output terminal OA1 of the first bank selector YP1 and the second output terminal OA2 of the first bank selector YP1, or the difference between currents outputted from the first output terminal OB1 of the second bank selector YP2 and the second output terminal OB2 of the second bank selector YP2, the memory system 10 can use the sensing device 100 to identify the information stored in two memory banks MBA and MBB. That is, to store the same amount of data, the memory system of prior art requires one big single memory bank while the memory system 10 may use two smaller memory banks. Therefore, the number of memory cells coupled to each bit line is decreased, reducing the parasitic capacitance on the bit lines and reducing the read current.

Furthermore, in some embodiments, the sensing device 100 can further sense the difference between a reference current and a current outputted from one of the first output terminal OA1 of the first bank selector YP1, the second output terminal OA2 of the first bank selector YP1, the first output terminal OB1 of the second bank selector YP2, and the second output terminal OB2 of the second bank selector YP2. For example, the memory system 10 may perform a verification operation after the program operation or the erase operation to check whether the program operation or the erase operation has been performed correctly, or the memory system 10 may perform a margin read operation to identify the data when the read current is rather small and difficult to be identified. In these cases, the sensing device 100 may sense the difference between the reference current and the read current generated by the selected memory cell.

In FIG. 2, the sensing device 100 further includes a reference current source 116, a first sensing selector 118A, and a second sensing selector 118B. The reference current source 116 can generate the reference current Iref. The first sensing selector 118A is coupled to the reference current source 116 and the first input terminal SA1 of the differential sense amplifier 114. The second sensing selector 118B is coupled to the reference current source 116 and the second input terminal SA2 of the differential sense amplifier 114. In some embodiments, the sensing selectors 118A and 118B can be analog multiplexers or switch circuits.

Figure 4:
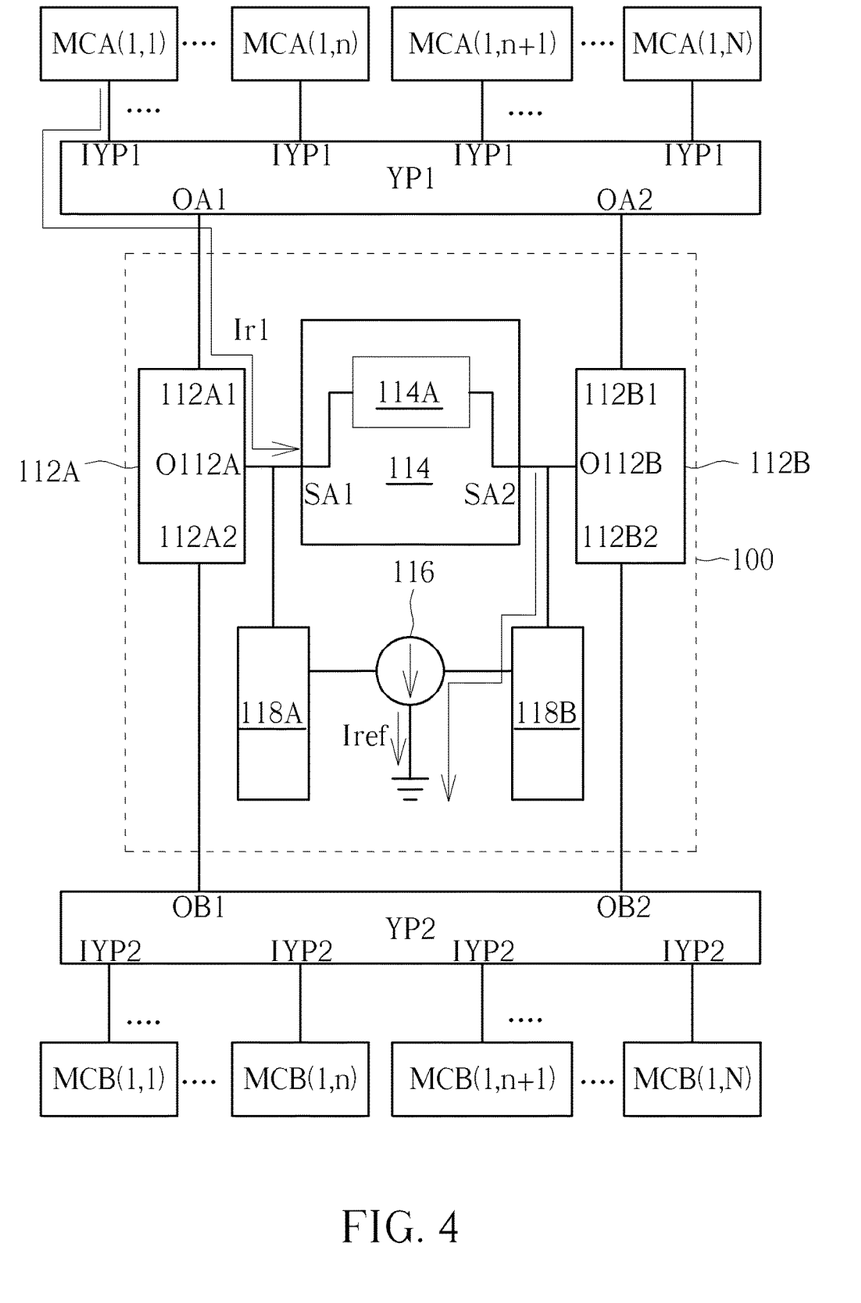
FIG. 4 shows the current paths of the memory system in FIG. 1 during a verification operation or a margin read operation of the selected first memory cell.

FIG. 4 shows the current paths of the memory system 10 during a verification operation or a margin read operation of the selected first memory cell MCA(1,1).

During the verification operation or the margin read operation of the selected first memory cell MCA(1,1), the first path selector YP1 establishes an electrical connection between the input terminal IYP1 of the first path selector YP1 coupled to the selected first memory cell MCA(1,1) and the first output terminal OA1 of the first path selector YP1. The second path selector YP2 establishes an electrical connection between an input terminal IYP2 of the second path selector YP2 and the second output terminal OB2 of the second path selector YP2. The first bank selector 112A establishes an electrical connection between the first input terminal 112A1 of the first bank selector 112A and the output terminal O112A of the first bank selector 112A. The second bank selector 112B establishes an electrical connection between the second input terminal 112B2 of the second bank selector 112B and the output terminal O112B of the second bank selector 112B. Also, the second sensing selector 118B establishes an electrical connection between the reference current source 116 and second input terminal of the differential sense amplifier 114.

Therefore, the differential sense amplifier 114 can receive the read current Ir1 generated by the first memory cell MCA (1, 1) and the reference current Iref generated by the reference current source 116.

In addition, although the second input terminal of the differential sense amplifier 114 receives the reference current Iref instead of the read currents generated by the second memory cells MCB (1,1) to MCB(M,N), the second bank selector 112B and the second path selector YP2 can still establish the electrical connections. The electrical connections provided by the second bank selector 112B and the second path selector YP2 can help to provide a matched capacitance.

For example, the effective capacitance of the path from the differential sense amplifier 114 through the first bank selector 112A and the first path selector YP1 to the input terminal IYP1 of the first path selector YP1 is substantially equal to the effective capacitance of the path from the differential sense amplifier 114 through the second bank selector 112B and the second path selector YP2 to the input terminal IYP2 of the second path selector YP2. Therefore, the loading of the read current generated by the first memory cell MCA(1,1) would match with the loading of the reference current Iref generated by the reference current source 116, improving the accuracy of the verification operation and the margin read operation.

Furthermore, to reduce the leakage current, the differential sense amplifier 114 can be pre-charged after the first path selector YP1 establishes the electrical connections, and the word line WLA1 can turn on the selected first memory cell MCA(1,1) after the differential sense amplifier 114 is pre-charged.

However, in some embodiments, the differential sense amplifier 114 can be a latch type differential sense amplifier. In this case, the differential sense amplifier 114 can be pre-charged after the first path selector YP1 establishes the electrical connections, and the word line WLA1 can turn on the selected first memory cell MCA(1,1) before the differential sense amplifier 114 is pre-charged.

With the sensing selectors 118A and 118B, the differential sense amplifier 114 can receive the reference current Iref during the verification operation and the margin read operation, and will not receive the reference current Iref during the read operation as shown in FIG. 3.

In summary, the memory system and the sensing device provided by the embodiments of the present invention can sense the read currents outputted from different memory banks, so the number of memory cells coupled to one single bit line can be reduced. Therefore, the reading current of the memory system can also be reduced. Furthermore, when performing the verification operation or the margin read operation, the memory system and the sensing device can also provide a load matching path to improve the accuracy of the operations.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A memory system, comprising:
   a first memory bank comprising N first bit lines;
   a first path selector comprising:
      N input terminals coupled to the N first bit lines;
      a first output terminal; and
      a second output terminal;
   a second memory bank comprising N second bit lines;
   a second path selector comprising:
      N input terminals coupled to the N second bit lines;
      a first output terminal; and
      a second output terminal; and
   a sensing device comprising:
      a first bank selector having a first input terminal coupled to the first output terminal of the first path selector, a second input terminal coupled to the first output terminal of the second path selector, and an output terminal;
      a second bank selector having a first input terminal coupled to the second output terminal of the first path selector, a second input terminal coupled to the second output terminal of the second path selector, and an output terminal; and
      a differential sense amplifier having a first input terminal coupled to the output terminal of the first bank selector and a second input terminal coupled to the output terminal of the second bank selector;
   wherein during a verification operation or a margin read operation of a selected first bit line:
      a first electrical connection is established between the first input terminal of the differential sense amplifier and the selected first bit line through the first bank selector and the first path selector; and
      a second electrical connection is established between the second input terminal of the differential sense amplifier and one of the N second bit lines through the second bank selector and the second path selector.

2. The memory system of claim 1, wherein:
   the first memory bank further comprises M×N first memory cells and each of the N first bit line is coupled to M first memory cells of the M×N first memory cells, wherein M is a positive integer and N is a positive integer greater than 1; and the second memory bank further comprises M×N second memory cells and each of the N second bit lines is coupled to M second memory cells of the M×N second memory cells.

3. The memory system of claim 2, wherein:
   the M×N first memory cells comprise a first set of first memory cells and a second set of first memory cells, and data saved in the first set of first memory cells are complementary to data saved in the second set of first memory cells; and
   the M×N second memory cells comprise a first set of second memory cells and a second set of second memory cells, and data saved in the first set of second memory cells are complementary to data saved in the second set of second memory cells.

4. The memory system of claim 3, wherein during a read operation of a selected first memory cell of the first set of first memory cells:
   the first path selector establishes a first electrical connection between an input terminal of the first path selector coupled to the selected first memory cell and the first output terminal of the first path selector, and establishes a second electrical connection between an input terminal of the first path selector coupled to a first memory cell of the second set of first memory cells complementary to the selected first memory cell and the second output terminal of the first path selector;
   the first bank selector establishes an electrical connection between the first input terminal of the first bank selector and the output terminal of the first bank selector; and
   the second bank selector establishes an electrical connection between the first input terminal of the second bank selector and the output terminal of the second bank selector.

5. The memory system of claim 4, wherein the selected first memory cell and the first memory cell complementary to the selected first memory cell are coupled to a same word line.

6. The memory system of claim 5, wherein:
   the differential sense amplifier is pre-charged after the first path selector establishes the first and the second electrical connections; and
   the same word line turns on the selected first memory cell and the first memory cell of the second set of first memory cells complementary to the selected first memory cell after the differential sense amplifier is pre-charged.

7. The memory system of claim 2, wherein the sensing device further comprises:
   a reference current source configured to generate the reference current;
   a first sensing selector coupled to the reference current source and the first input terminal of the differential sense amplifier; and a second sensing selector coupled to the reference current source and the second input terminal of the differential sense amplifier.

8. The memory system of claim 7, during a verification operation or a margin read operation of a selected first memory cell of the M×N first memory cells:
the first path selector establishes an electrical connection between an input terminal of the first path selector coupled to the selected first memory cell and the first output terminal of the first path selector;
the second path selector establishes an electrical connection between an input terminal of the second path selector and the second output terminal of the second path selector;
the first bank selector establishes an electrical connection between the first input terminal of the first bank selector and the output terminal of the first bank selector;
the second bank selector establishes an electrical connection between the second input terminal of the second bank selector and the output terminal of the second bank selector; and
the second sensing selector establishes an electrical connection between the reference current source and second input terminal of the differential sense amplifier.

9. The memory system of claim 8, wherein:
the differential sense amplifier is pre-charged after the first path selector establishes the electrical connection; and
a word line turns on the selected first memory cell after the differential sense amplifier is pre-charged.

10. The memory system of claim 8, wherein:
the differential sense amplifier is a latch type differential sense amplifier and is pre-charged after the first path selector establishes the electrical connection; and
a word line turns on the selected first memory cell before the differential sense amplifier is pre-charged.

11. The memory system of claim 8, wherein an effective capacitance of a path from the differential sense amplifier through the first bank selector and the first path selector to the input terminal of the first path selector is substantially equal to an effective capacitance of a path from the differential sense amplifier through the second bank selector and the second path selector to the input terminal of the second path selector.

12. The memory system of claim 2, wherein:
the first memory bank further comprises M word lines, each coupled to N first memory cells of the M×N first memory cells; and
the second memory bank further comprises M word lines, each coupled to N second memory cells of the M×N second memory cells.

13. A sensing device, comprising:
a first bank selector having a first input terminal coupled to a first memory cell, a second input terminal coupled to a second memory cell, and an output terminal;
a second bank selector having a first input terminal coupled to a third memory cell, a second input terminal coupled to a fourth memory cell, and an output terminal; and
a differential sense amplifier having a first input terminal coupled to the output terminal of the first bank selector, and a second input terminal coupled to the output terminal of the second bank selector;
wherein:
data saved in the first memory cell is complementary to data saved in the second memory cell; and
during a read operation of the first memory cell:
the first bank selector establishes an electrical connection between the first input terminal of the first bank selector and the output terminal of the first bank selector; and
the second bank selector establishes an electrical connection between the first input terminal of the second bank selector and the output terminal of the second bank selector.

14. A sensing device, comprising:
a first bank selector having a first input terminal coupled to a first memory cell, a second input terminal coupled to a second memory cell, and an output terminal;
a second bank selector having a first input terminal coupled to a third memory cell, a second input terminal coupled to a fourth memory cell, and an output terminal; and
a differential sense amplifier having a first input terminal coupled to the output terminal of the first bank selector, and a second input terminal coupled to the output terminal of the second bank selector;
a reference current source configured to generate a reference current;
a first sensing selector coupled to the reference current source and the first input terminal of the differential sense amplifier; and
a second sensing selector coupled to the reference current source and the second input terminal of the differential sense amplifier.

15. The sensing device of claim 14, wherein during a verification operation or a margin read operation the first memory cell:
the first bank selector establishes an electrical connection between the first input terminal of the first bank selector and the output terminal of the first bank selector;
the second bank selector establishes an electrical connection between the second input terminal of the second bank selector and the output terminal of the second bank selector; and
the second sensing selector establishes an electrical connection between the reference current source and the second input terminal of the differential sense amplifier.

* * * * *